(12) United States Patent
Blanc et al.

(10) Patent No.: US 6,468,835 B1
(45) Date of Patent: Oct. 22, 2002

(54) METHOD FOR MAKING SMART CARD OR SIMILAR ELECTRONIC DEVICE

(75) Inventors: René-Paul Blanc, Nans les Pins (FR); Jean-Christophe Fidalgo, Gémenos (FR); Philippe Patrice, Allauch (FR)

(73) Assignee: Gemplus, S.C.A., Gemenos Cedex (FR)

( * ) Notice: Subject to any disclaimer, the term of this patent is extended or adjusted under 35 U.S.C. 154(b) by 0 days.

(21) Appl. No.: 09/381,797

(22) PCT Filed: Mar. 25, 1998

(86) PCT No.: PCT/FR98/00592

§ 371 (c)(1),
(2), (4) Date: Dec. 15, 1999

(87) PCT Pub. No.: WO98/44452

PCT Pub. Date: Oct. 8, 1998

(30) Foreign Application Priority Data

Mar. 27, 1997 (FR) .................................. 97 04093

(51) Int. Cl.⁷ .............................................. H01L 21/44
(52) U.S. Cl. ...................... 438/127; 438/124; 438/126
(58) Field of Search .................... 438/123, 124, 438/125, 126, 127, 11.2

(56) References Cited

U.S. PATENT DOCUMENTS 5,690,773 A * 11/1997 Fidalgo et al. .............. 156/267
6,132,799 A * 10/2000 Corniglion et al. ......... 427/105

FOREIGN PATENT DOCUMENTS

| DE | 4325458 A | | 2/1995 |
| EP | 0762323 A | | 3/1997 |
| FR | 2624284 | * | 6/1989 |

* cited by examiner

Primary Examiner—Kevin M. Picardat
(74) Attorney, Agent, or Firm—Burns, Doane, Swecker & Mathis, L.L.P.

(57) ABSTRACT

The invention concerns a method for making an electronic device such as a smart card which includes at least a microcircuit embedded in a carrier medium and which includes exit hubs linked to interface elements composed of a terminal block and/or an antenna. The connections between the exit hubs and the interface elements are made by depositing a low-viscosity conducting substance which remains flexible after its application, using a syringe or similar device. Preferably, a polymer resin charged with conducting or intrinsically conducting particles is used for the connections.

34 Claims, 4 Drawing Sheets

METHOD FOR MAKING SMART CARD OR SIMILAR ELECTRONIC DEVICE

The present invention concerns the making of electronic units including at least one microcircuit which is embedded in a carrier medium and linked to interface elements consisting of a terminal block and/or an antenna, such as integrated circuit cards with or without contacts, also known as smart cards.

The invention also applies, in particular, to electronic labels which are used to identify products and which can be compared with smart cards without contacts.

The present invention concerns more particularly the making of connections between the microcircuit and the interface elements, such as a terminal block and/or antenna.

There are contact smart cards with interface terminal blocks, smart cards without contacts with an antenna housed in the carrier medium and hybrid cards or combicards which have an interface terminal block and an antenna.

There are numerous methods for making smart cards with contacts. Most of these methods are based on assembly of the chip in a sub-set called a micromodule which is assembled using traditional methods.

One method, illustrated in FIG. 1, involves first attaching the chip or microcircuit 20 ("die attach") which involves gluing a chip 20, cut from a board by sawing, arranging it with its active side with its exit hubs 22 upwards and by sticking the opposite side on a dielectric support plate 28, using a glue which could be conducting, the gluing being done on a printed circuit or film.

Then microcabling or soldering of connections is done ("wire bonding"), involving soldering the connection of the exit hubs 22 of the chip 20 with the terminal block of contacts 24 of the printed circuit plate.

Then the case is coated ("potting"), involving protecting the chip 20 and the soldered connection wires 26 using a resin 30 which could be silicone or polyurethane based, for example.

In a variation of this method illustrated in FIG. 2, a peripheral metallic ring 32 is used to rigidify the micromodule around the resin 30.

In another variation of this method ("flip chip"), a chip with bumps or protuberances placed with the active side downward is used, the electrical connection being provided either by metallic or polymer bumps or by an anisotropic adhesive.

In other variations, tape automated bonding (TAB) is used, as illustrated in FIG. 3, according to which the chip 34 is glued using an anisotropic glue 36 and the various contacts of the film 38 are soldered by thermocompression on the chip 34 which has bumps 39.

There are also methods for making smart cards with contacts without using micromodules. One method is based on using screen printing to form contacts and to provide chip interconnections.

Another method involves metallisation in three dimensions of the body of the card, followed by transfer of the chip using classic technology (gluing plus microcabling) or by the "flip chip" technique described above.

In the methods which use a micromodules, the associated costs are limited by the price of the film. In addition, it is often necessary, after the encapsulation operation, to mill the resin to reduce the thickness of the unit. This operation is difficult because the resin is polymerised and thus very rigid. The milling is the main cause of production rejects.

In the first method without micromodules described above, this latter is on the surface and thus subject to exterior stresses, greatly increasing the associated cost. For the second method without micromodules the number of steps is high which also increases the cost.

This technology would therefore not be suitable for making large chip cards.

There are two large families of methods for making smart cards without contacts. The first uses an antenna made by winding which is either soldered on a micromodule containing the chip, or directly on a chip with bumps. Such a technique can only be used for chips with simple operation.

The second family uses a "flat" antenna which can be in the form of a rectangular peripheral spiral or any other appropriate form. Such an antenna can be made by photogravure, mechanical cutting, stamp printing, screen printing, or offset printing with a conducting ink. The chip is then transferred to the antenna using the "flip-chip" technique or a classic technique.

In these methods for making smart cards without contacts, micromodule manufacturing is used which, as mentioned above, involves numerous steps for assembling the chip and implies substantial costs, or the "flip-chip" technique for which the pace is limited and the installation costs particularly high.

The methods for hybrid smart cards combine the disadvantages previously mentioned for smart cards both with and without contacts.

The basic purpose of the invention is to provide a method for making connections between a microcircuit and the interface elements in an electronic unit (such as a smart card) including at least one microcircuit which is embedded in a carrier medium and which includes exit hubs linked to interface elements including a terminal block and/or an antenna which do not have the above mentioned disadvantages and which make it possible in particular to reduce the cost and percentage of production rejects without making micromodules.

The method according to the invention is remarkable in that it involves depositing, using a syringe or similar device, of a drop of a low-viscosity conducting substance between each exit hub and the corresponding interface element, the said conducting substance acting by polymerisation, including conducting charges and remaining flexible after polymerisation.

This method makes it possible to eliminate the making of micromodules and to reduce the number of production steps.

In addition, flexible connections are obtained whereas the connections of the known type are rigid or semi-rigid and this sharply reduces the rate of production rejects.

Advantageously, the terminal block is also made by depositing a low-viscosity conducting substance.

This makes it possible to further simplify the method with the making of the terminal block and its connections done in a single operation.

Advantageously, the antenna is also made by depositing a low-viscosity conducting substance.

This makes it possible to simplify the production and to improve the antenna performance.

The substance should preferably be a polymer resin charged with conducting or intrinsically conducting particles.

Other characteristics and advantages of the invention will appear with the reading of the detailed description which follows. These will be more clearly understood by consulting the appended drawings in which:

FIG. 4 shows a smart card with contacts made according to a method according to the invention.

Figure 1:
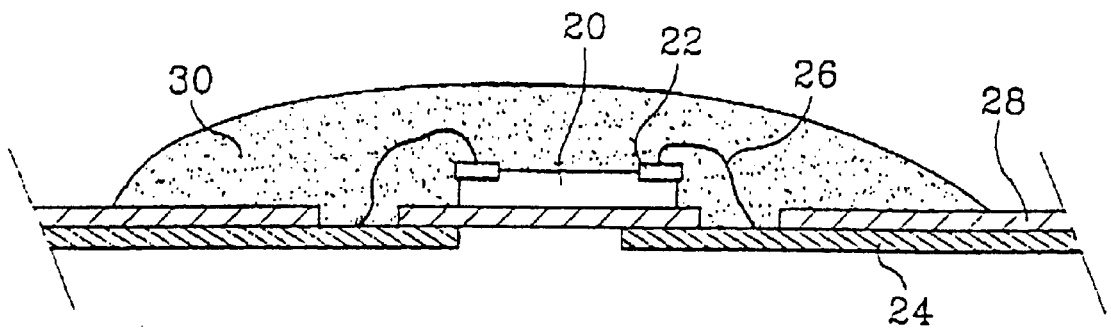
FIG. 1 is a cross-section diagram which illustrates a known method for making smart cards with contacts.
Figure 2:
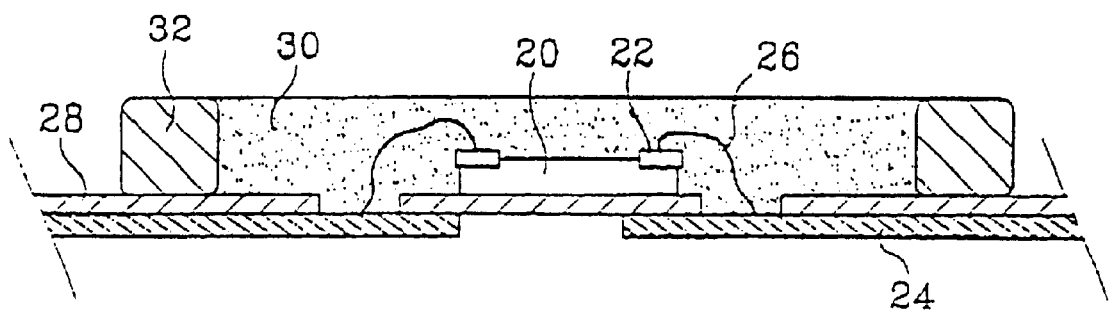
FIG. 2 illustrates a variation of the method shown in FIG. 1.
Figure 3:
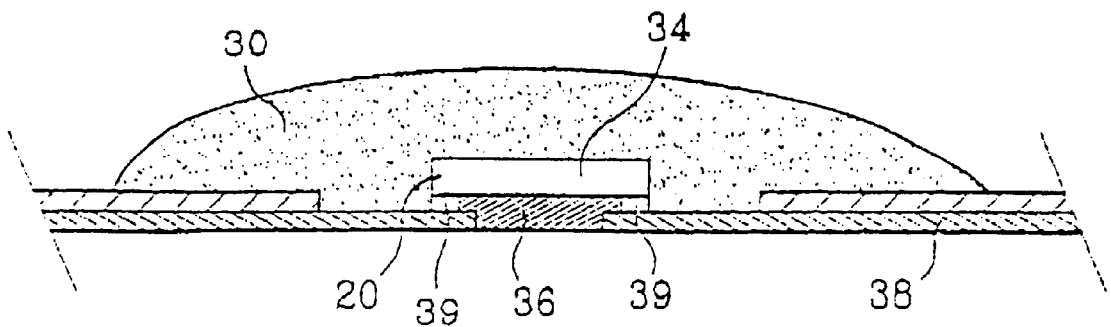
FIG. 3 illustrates another variation of the method shown in FIG. 1.
Figure 4:
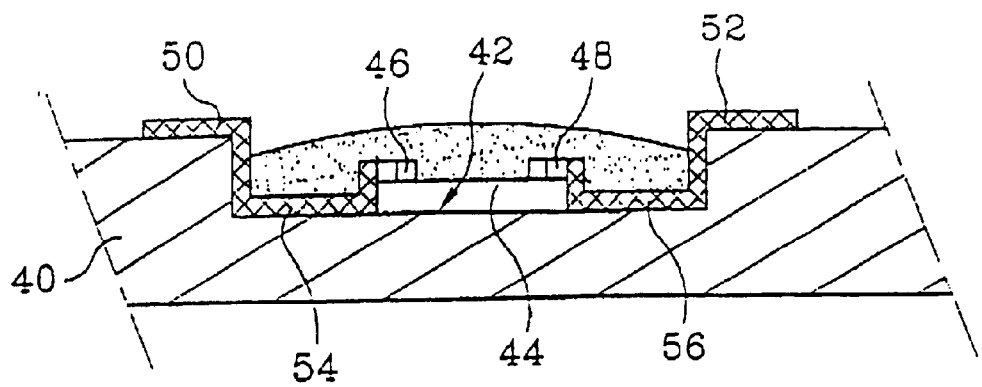
FIG. 4 illustrates a system for the method based on the invention applied to the making of smart cards with contacts.

Initially, a card body 40 is made which includes a cavity 42 which can be made by moulding by injection or by colamination of thermoplastic sheets followed by machining of the cavity.

In a second step, the chip 44 is placed in the cavity with its active side, and particularly its exit hubs 46 and 48, facing upwards, and it is attached by gluing, for example. Local heating of the cavity can also be done followed by placing the chip in the molten thermoplastic material. The active side of the chip does not have to be on the same level as the bottom of the cavity.

In a third step, the contact terminal block and the connections with the exit hubs 46 and 48 are made by depositing a low-viscosity conducting substance, for example a polymer resin charged with conducting or intrinsically conducting particles, by a technique called "dispensing" by which a liquid or low-viscosity substance is applied using a syringe or similar device with controlled outflow and opening.

This depositing operation, hereafter referred to as dispensing, is done for example using a commercially-available unit called CAM/ALOT made by the American company Camelot Systems Inc. and used for on-line production of electronic circuits. The movement and opening of the syringe is controlled by a computer program.

The conducting resin is thus deposited, making the contacts 50 and 52 of the interface terminal block of the smart card and connections 54 and 56 between the contacts 50 and 52 and the exit hubs 46 and 48 of the chip. The thickness of these deposits can be much greater than by a screen printing method, allowing for larger sections and thus low contact resistance.

Advantageously, the exit hubs 46 and 48 include non-oxidisable metal such as nickel, titanium or tungsten.

These hubs can also have bumps in order to improve the electrical contact.

To correct chip positioning errors, regulation using an image of the chip provided by a computer visualising system will be used.

Resins with an activation temperature which is below the temperature of softening of the thermoplastic material of the card body should preferably be used.

Figure 5:
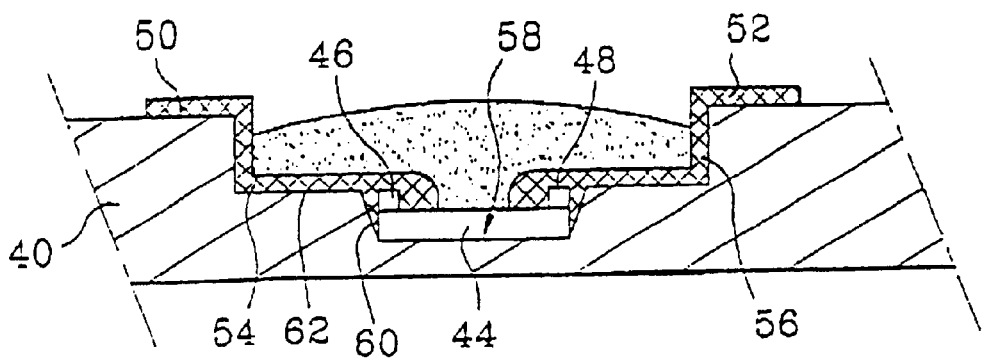
FIG. 5 illustrates a variation of the method shown in FIG. 4.

FIG. 5 illustrates a variation of the previously mentioned method in which a two-level cavity is made, i.e. a cavity 58 with a recess 60 at its bottom. The dimensions of this recess are sufficient for it to receive the chip 44 and its depth is essentially the same as the thickness of the chip so that its active side is at the bottom level 52 of the cavity 58. This arrangement avoids a second change of slope of the resin cords in the cavity, which facilitates contact of the conducting resin with the exit hubs 46 and 48.

In the fourth and final step, an encapsulating (potting) is done which involves protecting the chip by using a resin, for example a silicone or polyurethane based resin.

Figure 6:
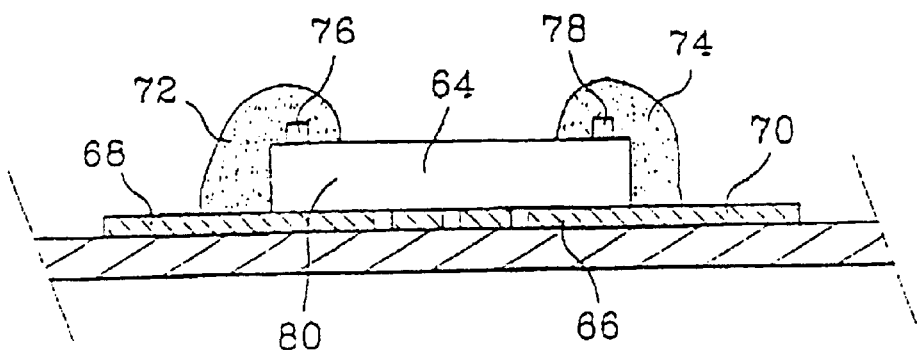
FIG. 6 illustrates a system applied to the making of smart cards without contacts.
Figure 7:
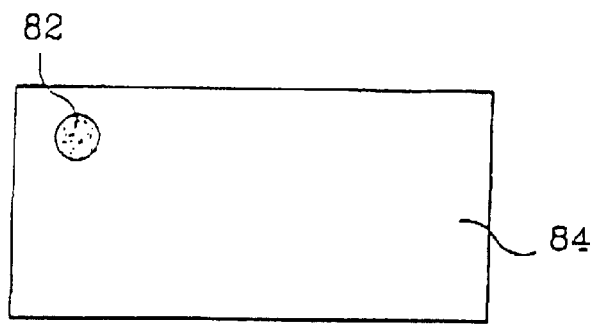
FIGS. 7 to 10 illustrate a variation of the method shown in FIG. 6.
Figure 8:
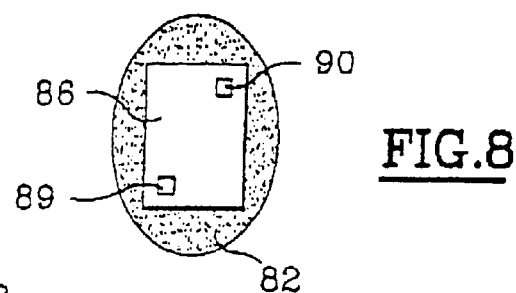
Figure 9:
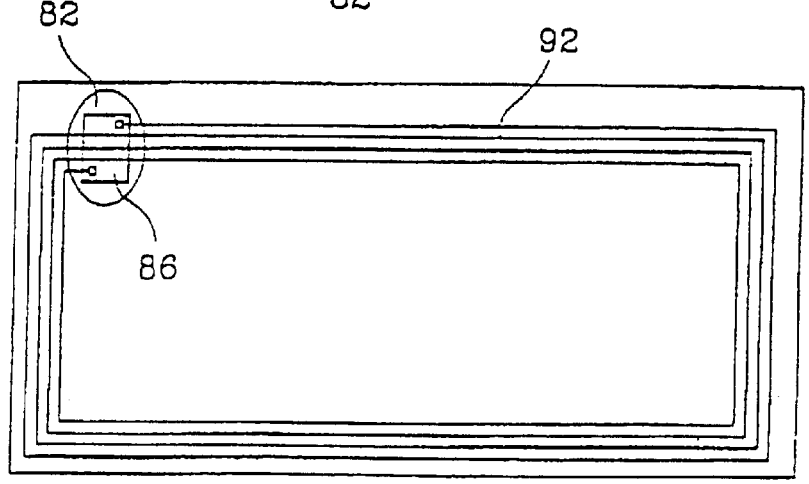

FIG. 6 shows a smart card without contact made according to the invention method. It includes a "flat" antenna made of a track in, for example, the form of a rectangular spiral arranged on the periphery of the card as shown in FIG. 9.

In a first step, a chip 64 is glued with its active side facing up at the place chosen for the connection using classic "die attach" method and equipment and using a glue 66 which allows for gluing on a printed circuit or film. A glue is chosen which is compatible with the maximum use temperature of the antenna support, for example an adhesive which reticulates when exposed to ultraviolet rays. The pace of this gluing operation may be very high, for example five to six thousand pieces per hour with a single head. It is important that the fillet of glue be perfectly controlled in the perimeter of the chip located facing the antenna connection areas 68 and 70.

In a second step, the electrical connections 72 and 74 are made with a conducting resin between the exit hubs 76 and 78 of the chip 80 and the connection areas 68 and 70 of the antenna.

This second step can also be done at the same fast pace as the chip gluing step. These two steps can be done with the same equipment.

According to one variation, the flat antenna is made with a "dispensing" technique and the gluing of the chip is done by the "flip chip" technique described above.

According to another variation illustrated in FIGS. 7 to 10, the chip is first glued and then the antenna is made using a "dispensing" technique on the active side of the chip.

In the first step (FIG. 7), an insulating adhesive 82 (epoxy type for example) is dispensed onto a support 84 (vinyl polychloride or polyethylene for example) at the place where the chip with the contact bumps will then be attached.

Adhesives for the "die attach" technique adapted to the support can thus be used.

In a second step (FIG. 8), a chip 86 is set with its active side facing upwards on the adhesive 82 for a "die attach" type gluing. The contact bumps improve the electrical contact between the exit hubs 88 and 90 of the chip and the antenna. The non-operational exit hubs may be insulated by applying a dielectric varnish.

In a third step (FIG. 9), the antenna 92 is applied by the technique of dispensing a conducting substance, for example an ink or glue, with movement of the syringe using, for example, the CAM/ALOT equipment mentioned above.

Figure 10:
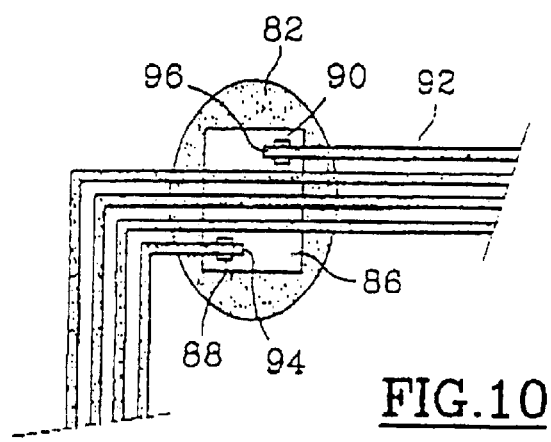

FIG. 10 shows that the extremities 94 and 96 of the rectangular spiral which makes up the antenna 92 cover the contact hubs 88 and 90 of the chip 86, respectively.

In the fourth and final step, colamination is done to finish the card.

Figure 11:
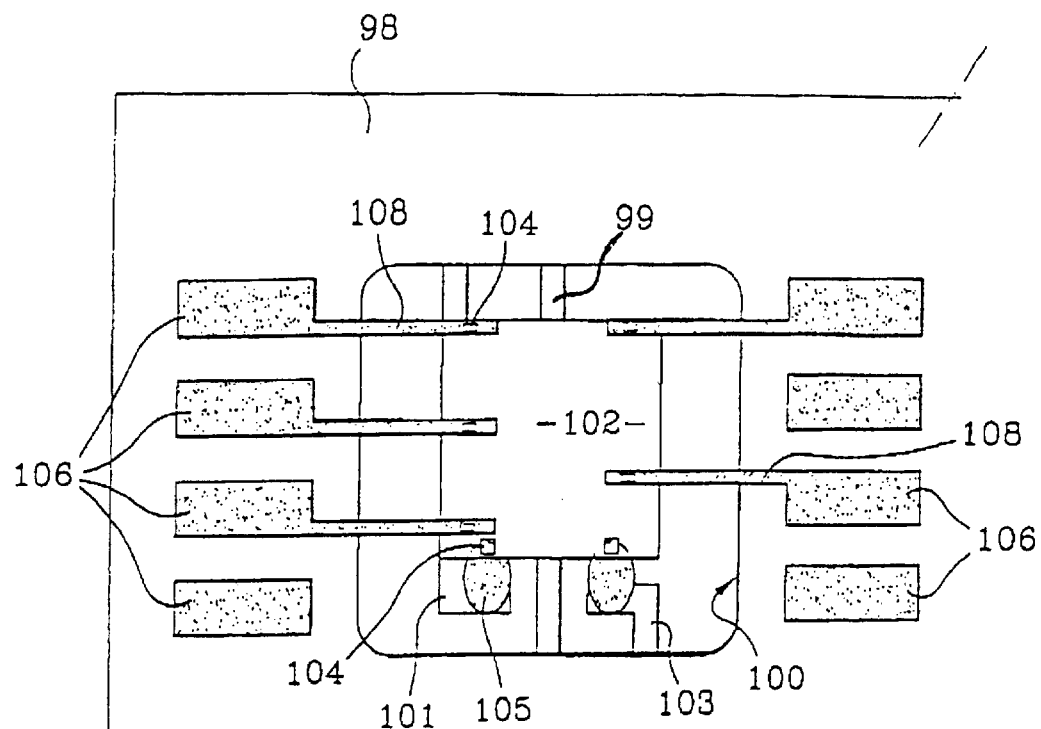
FIG. 11 illustrates a system applied to the making of hybrid smart cards.

FIG. 11 shows a hybrid smart card made by a method based on the invention. In this case, the two previously described methods are combined.

In a first step, the card 98 body is made including an incorporated antenna 99 including two contact hubs 101 and 103. In a second step, a cavity 100 is made in the body of the card. In a third step, the chip 102 is attached with its active side and its exit hubs 104, which preferably include non-oxidisable metal plating, in the cavity, by gluing for example.

In a fourth step, the contact terminal block 106 and its connections 108 with the exit hubs 104 of the chip and its connections 105 of the contact hubs 101 and 103 of the antenna with the exit hubs 104 are made by depositing a conducting resin 105 by a dispensing technique. The hubs 104 can include contact bumps.

The angular positioning errors of the chip 102 can be corrected as described above by using computer visualising equipment.

In the fifth and final step, the encapsulation of the chip is done.

Figure 12:
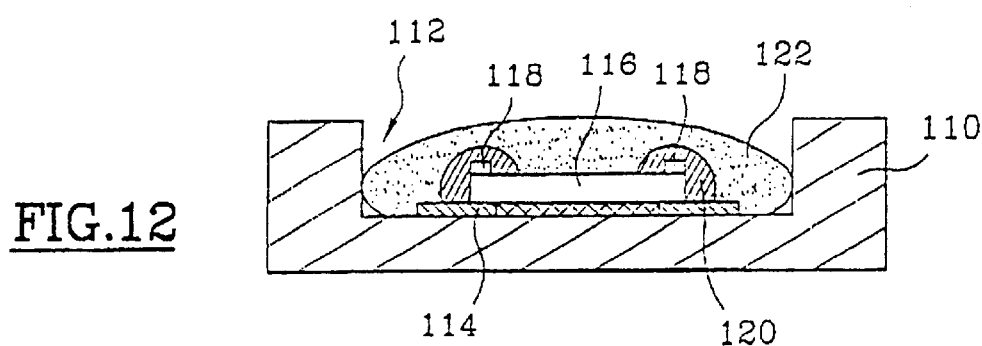
FIGS. 12 and 13 illustrate a system applied to the making of electronic labels.
Figure 13:
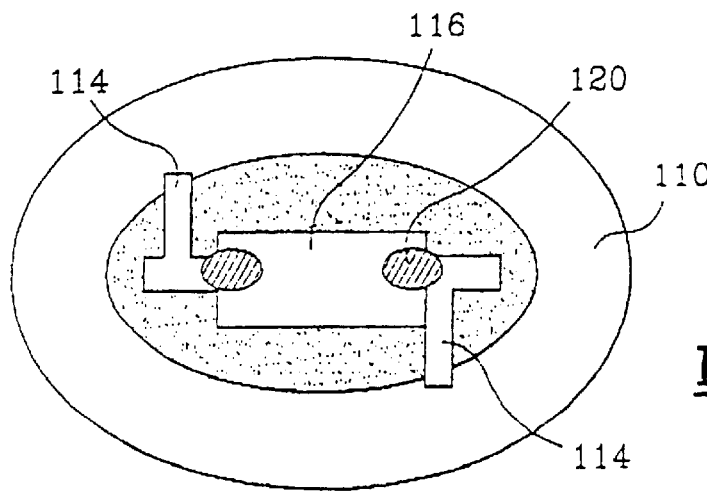

The invention applies to the production of all electronic devices which have at least one microcircuit which is embedded in a carrier medium and which includes exit hubs linked to interface elements including a terminal block and/or an antenna. In particular, the invention allows for manufacturing of electronic labels as shown in FIGS. 12 and 13.

A support 110 includes a cavity 112 at the bottom of which an antenna 114 is installed. A microcircuit 116 is then attached here with its exit hubs 118 facing upwards. A conducting resin 120 is applied by a dispensing technique to make the connections between the antenna 114 and the exit hubs 116 of the chip. Encapsulation is then done using an insulating resin 122.

The invention makes it possible to eliminate the making of a micromodule and particularly the milling operation. The rate of production rejects is thus greatly reduced.

The number of steps is reduced, greatly simplifying the production and substantially reducing the cost price. These factors are further enhanced by the fact that some of the chip gluing and connection making operations can be done with the same equipment.

The invention does not use costly equipment, thereby reducing production costs.

The making of the antenna by the dispensing technique yields a maximum area, thereby improving antenna performance with respect to the classic incorporated wound antennae.

The invention allows for making complex and large cards in a simple and economical way.

The making of connections using the technique of "dispensing" a substance which remains flexible after its activation reduces rigidity and considerably increases the smart cards' resistance to bending-torsion. Smart cards made according to the invention method have much higher resistance to stress than that required by the current standards.

As indicated above, the invention allows for very high production rates, on the order of 4000 smart cards per hour for example, with a very low reject rate.

What is claimed is:

1. A method for making an electronic device such as a smart card having at least one microcircuit which is embedded in a carrier medium and which includes exit hubs linked to interface elements composed of a terminal block and/or an antenna, comprising the step of:
   dispensing a low-viscosity conducting substance which remains flexible after its application using a syringe-like device to form connections between the exit hubs and the interface elements.

2. A method according to claim 1, further including the step of depositing a low-viscosity conducting substance to form said terminal block.

3. A method according to claim 1, further including the step of depositing a low-viscosity conducting substance to form said antenna.

4. A method according to claim 1, wherein said substance is a polymer resin charged with conducting particles.

5. A method according to claim 1, wherein said substance is a polymer resin charged with intrinsically conducting particles.

6. A method according to claim 1, wherein the step of dispensing the low-viscosity conducting substance is done with relative displacement of an electronic device and a syringe.

7. A method according to claim 6, wherein said relative displacement is controlled by a computer program.

8. A method according to claim 7, further including the step of correcting the position of the electronic device by imaging with a computer visualization system.

9. A method according to claim 4, wherein said carrier medium is made of a thermoplastic material, and the activation temperature of the substance is lower than the softening temperature of said thermoplastic material.

10. A method according to claim 1, wherein said exit hubs have non-oxidizable metallization.

11. A method according to claim 2, wherein said electronic unit is a smart card with contacts, having a card body that includes a cavity, and said step of dispensing a conducting substance is carried out to form the terminal block and the connections, and further including the step of encapsulating the microcircuit.

12. A method for making a smart card with contacts according to claim 11, wherein the microcircuit has contact bumps.

13. A method for making a smart card with contacts according to claim 11, wherein said cavity has a recess at its bottom to receive the microcircuit.

14. A method according to claim 1, wherein said electronic unit is a smart card without contacts or an electronic label, and having a flat antenna and a microcircuit that is attached to the card with its active side facing upward, and wherein said step of dispensing a low-viscosity conducting substance is carried out to form connections between the exit hubs of the microcircuit and the hubs of the antenna.

15. A method according to claim 3, wherein said electronic unit is a smart card without contacts or an electronic label, and said microcircuit has contact bumps and is attached to said smart card with its active side facing downward, and further including a flat antenna that is made by depositing a low-viscosity conducting substance.

16. A method according to claim 3, wherein said electronic unit is a smart card without contacts or an electronic label, and said microcircuit is attached to said card with its active side facing upwards, further including the steps of depositing an insulating adhesive on a support using a syringe-like device, applying a flat antenna directly onto the microcircuit by depositing a low-viscosity conducting substance, and performing a final colamination operation.

17. A method according to claim 2, wherein said electronic unit is a hybrid smart card having a card body that includes an integrated antenna, and a cavity in the body of the card, and said microcircuit is attached with its active side facing upwards in the cavity, wherein said step of dispensing a low-viscosity conducting substance is carried out to form the terminal block and its connections, and further including the step of encapsulating said microcircuit.

18. A method for making a hybrid smart card according to claim 17, wherein the microcircuit includes contact bumps.

19. A method for making a hybrid smart card according to claim 17, wherein the step of dispensing a low-viscosity conducting substance is carried out with correction of microcircuit angular positioning errors using a computer visualization system.

20. A method for making an electronic device according to claim 1, wherein the flexible, low viscosity conducting substance has a cord shape and extends between at least one of the exit hubs of the microcircuit and at least one of the interface elements.

21. A method for making an electronic device having a carrier medium, at least one communication interface, the at least one communication interface comprising an antenna and/or a terminal block, and at least one microcircuit which is embedded in a carrier medium, the microcircuit having an exit hub on an active side of the microcircuit, the exit hub linked to the communication interface by a connection, the method comprising the steps of:

attaching the microcircuit active side up on the carrier medium; and forming the connection between the exit hub and the communication interface by dispensing a low viscosity conducting substance in a cord shape with a syringe having flux and flow control, wherein the low-viscosity conducting substance extends from the exit hub to the communication interface and remains flexible after application.

22. A method according to claim 21, wherein conductivity of the low-viscosity conducting substance is activated by heating the substance to a temperature above an activation temperature of the low-viscosity conducting substance, the method comprising:

heating the low-viscosity conducting substance to a temperature above the activation temperature of the low-viscosity conducting substance, wherein the activation temperature of the low-viscosity conducting substance is lower than a softening temperature of the thermoplastic material.

23. A method according to claim 21, wherein the dispensing includes relative motion between the syringe and the electronic device.

24. A method according to claim 21, wherein the communication interface includes a terminal block, and wherein the method comprises:

forming the terminal block by dispensing a low-viscosity conducting substance with a syringe.

25. A method according to claim 24, wherein the smart card has contacts and a cavity, the method further comprising the steps of:

encapsulating the microcircuit and at least a portion of the deposited cord or the terminal block.

26. A method according to claim 21, wherein the communication interface is an antenna, and wherein the method comprises:

forming the antenna by the dispensing of a low-viscosity conducting substance with a syringe.

27. A method according to claim 26, wherein the antenna is flat.

28. A method according to claim 21, wherein the smart card is without contacts or an electronic label, wherein the smart card includes a flat antenna, and wherein said depositing a low-viscosity conducting substance forms a connection between an exit hub of the microcircuit and a hub of the flat antenna.

29. A method according to claim 25, wherein the microcircuit has contact bumps.

30. A method according to claim 29, comprising:

depositing a low-viscosity conducting substance to form the contact bumps.

31. A method according to claim 25, wherein the cavity has a recess at a bottom of the cavity to receive the microcircuit, the recess having a depth approximately equal to a thickness of the microcircuit, and wherein the attaching of the microcircuit to the body of the smart card comprises attaching the microcircuit within the cavity with the active side up, wherein the active side of the microcircuit is approximately flush with the bottom of the cavity.

32. A method according to claim 21, the method comprising:

forming a flat antenna by depositing a low-viscosity conducting substance on the active side of the microcircuit; and performing a colamination operation.

33. A method according to claim 23, wherein correction of a relative position includes imaging with a computer visualization system.

34. A method according to claim 23, wherein the relative motion is controlled by a computer program.

* * * * *